United States Patent [19]

Paul

[11] Patent Number: 4,862,287
[45] Date of Patent: Aug. 29, 1989

[54] POWER LINE MONITOR AND PRINTER SYSTEM

[75] Inventor: Gerald R. Paul, Webster, N.Y.

[73] Assignee: Mendon Electronics Corporation, Pittsford, N.Y.

[21] Appl. No.: 102,881

[22] Filed: Sep. 30, 1987

[51] Int. Cl.$^4$ .................. G01R 19/00; G01R 19/30
[52] U.S. Cl. ........................... 358/296; 324/103 P; 361/88; 340/661; 364/483; 365/228
[58] Field of Search .............. 324/100, 103 P, 103 R, 324/113; 340/660, 661, 662, 663, 664; 365/226, 227, 228, 229; 364/200, 483; 361/88; 358/296

[56] References Cited

U.S. PATENT DOCUMENTS

| | | | |
|---|---|---|---|
| 4,458,307 | 7/1984 | McAnlis | 364/200 |
| 4,558,275 | 12/1985 | Borowy | 324/103 P |
| 4,600,962 | 7/1986 | Bliehall | 361/77 |

Primary Examiner—E. A. Goldberg
Assistant Examiner—Scott A. Rogers
Attorney, Agent, or Firm—Shlesinger, Fitzsimmons & Shlesinger

[57] ABSTRACT

A dot line printer is releasably connected by a control circuit to the output of a monitor which senses variations or faults in the AC line voltage for a computer or the like. Each time the monitor senses any one of the five different voltage disturbances, the information is transmitted as digital data to the printer, which then produces a continuous strip chart or graphical printout of the voltage variations. The printer advances paper continuously and in small increments, while printing thereon six parallel trace lines that extend in the longitudinal or feed direction of the paper. One trace line represents time, and the remaining lines the zero ordinates for five different voltage faults. Whenever a fault is detected, the associated trace line widens to print a horizontal bar. When a power failure occurs and is thereafter restored, a header (indica line) is printed on the paper before printing of the trace lines resumes. The monitor and printer, if desired, may be operated independently of each other.

9 Claims, 4 Drawing Sheets

POWER LINE MONITOR AND PRINTER SYSTEM

BACKGROUND OF THE INVENTION

This invention relates to power line monitors, and more particularly to an improved system for monitoring the power supply to computers, or the like. Even more particularly, this invention relates a combined power line monitor and printer system which senses and records voltage variations which would deleteriously effect computer operations.

Heretofore a variety of devices have been developed and utilized for monitoring the voltage supply to computers and the like. U.S. Pat. No. 4,600,962, for example, discloses a monitoring system which includes a sensing circuit for detecting undesirable changes in the power supply to computers, together with associated alarm and timing circuits. The disadvantage of this type of system, however, is that it is extremely complicated, and does not supply a hard copy printout of the sensed errors. U.S. Pat. No. 3,950,759 also denotes a monitoring system, but it is particularly designed for use with a welding unit; and although it does provide a hard copy printout of current and voltage variations, it is not adaptable to monitoring power supplies for lower DC power operated units such as computers and the like.

U.S. Pat. Nos. 4,586,104 and No. 4,470,041 also disclose monitoring circuits for computers and the like, but neither is designed to provide a hard copy printout or record of the sensed errors. Moreover, in none of the above-noted systems is there disclosed a stand-alone monitor or sensor in combination with a separate printer, the input of which optionally can be connected to the output of the sensor module.

It is an object of this invention, therefore, to provide an improved power supply monitoring system which is particularly suited for use in connection with computers, and which utilizes an improved sensor and printer combination to produce a hard copy record of the various power supply faults detected by the sensor.

Still a further object of this invention is to provide an improved monitoring system of the type described in which a fault monitor and printer are coupled together to provide a continuous, hard copy record of the faults sensed by the monitor.

Another object of this invention is to provide a novel control circuit for selectively coupling a fault-sensing monitor to a line printer to enable operation of the monitor with or without the printer.

A further object of this invention is to provide an improved power supply monitoring system of the type described which continuously produces in multi-track form a hard copy record of each detected fault and the time at which a respective fault occurred.

Other objects of this invention will be apparent hereinafter from the specification and from the recital of the appended claims, particularly when read in conjunction with accompanying drawings.

SUMMARY OF THE INVENTION

The monitoring system includes a sensing module which senses or monitors incoming AC line voltage. Whenever the voltage spikes or rises above a predetermined sine wave peak, one of five different LED's is latched on. If the AC voltage exceeds a predetermined value for more than a few cycles a second one of the LED's is latched on, and if the AC voltage falls below a predetermined low level for more than a few cycles, a third one of the LED's is latched on. If the AC supply drops out or is interrupted for a predetermined interval, a fourth one of the LED'S is latched on, and a fifth LED is latched on whenever the power is completely interrupted for a predetermined number of cycles. Each of the five indicators is operable selectively, and does not, when energized, interfere with the operation of the remaining LED's. The sensing module includes also a pushbutton for resetting the module, and a green light for indicating when it is receiving power.

The associated printer is connected to the output of the sensor module in such manner that each time the monitor senses any one of the above-noted five disturbances, the information is transmitted to the printer, which then produces a continuous, analogue or graphical printout of the voltage variations. In practice the printer advances or feeds the so-called hard copy or paper continuously and in small increments, while printing thereon six parallel trace lines that extend in the longitudinal or feed direction of the paper. One trace line represents time, and the remaining lines the zero ordinates for the five faults. Whenever a fault is detected, the associated trace line widens to print a horizontal bar. When a power failure occurs (purposefully or otherwise) and thereafter is restored, a header line is printed and normal operation resumes. During printer operation the timer trace line periodically widens to form timing marks on the hard copy at predetermined (e.g. fifteen minute) intervals.

PREFERRED EMBODIMENTS OF THE INVENTION

Figure 1:
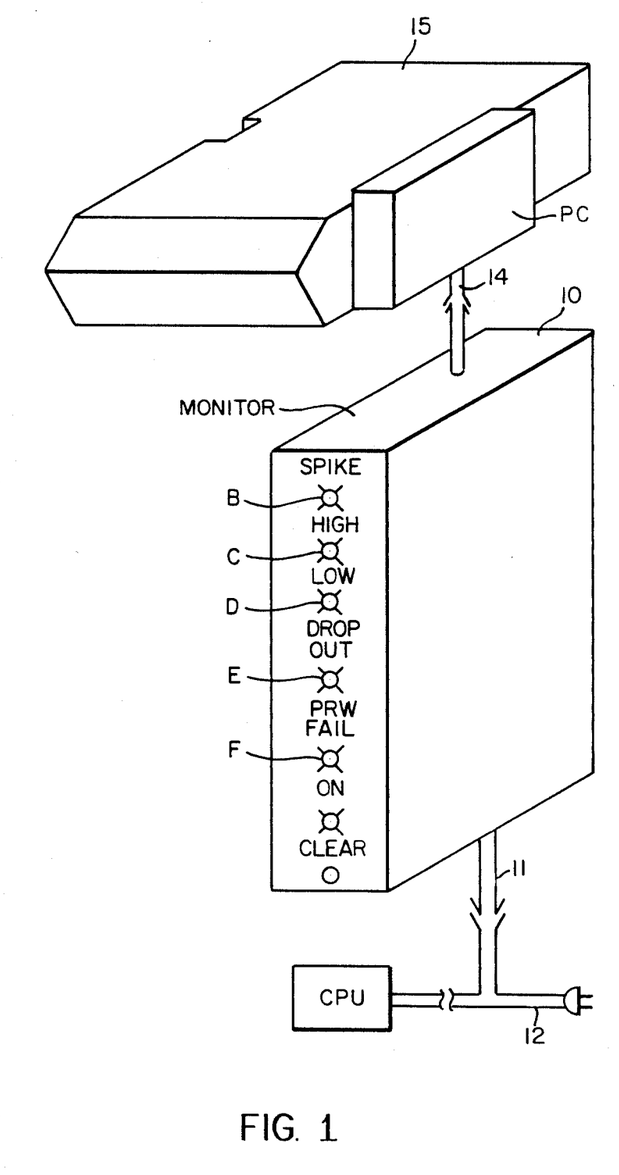
FIG. 1 a fragmentary perspective view of the system showing the power supply monitoring module with its input connected to the, AC power supply that is to be monitored, and its out by a novel printer control circuit to a dot printer.

Referring now to the drawings by numerals of reference, and first to FIG. 1, 10 denotes a monitor having an input 11, which is adapted to be connected to the power supply 12 for the CPU of a computer, or the like, in order to monitor the various characteristics of the power supply—namely, the presence of a voltage spike in the supply, the presence of an unusually high or low voltage signal, actual drop out or disappearance of the voltage signal for a given period, and complete power failure. To provide a visual indication of these characteristics, the monitor 10 includes a series of LED's denoted in FIG. 1 at B,C,D, E and F respectively. These LED's are mounted in the housing of monitor 10 to be visible through openings in one end of the housing, and are identified by the indicia Spike, High, Low, Drop Out, and PRW Fail, respectively. One additional LED is mounted in the housing of monitor 10 beneath the above-noted LED's to indicate when the monitor is turned on (ON). A pushbutton denoted CLEAR is also mounted on the monitor to test the monitor and clear any indicated faults.

Monitor 10 also has an output disposed releasably to be connected, by a cable 14 to a printer controller or interface PC, which in turn is releasably connected to a graphical dot line printer 15, which by way of example may be of the type sold by Seiko Instruments & Electronics, Ltd., under the designation LTP251-192A. This printer has a stationary thermal printing head capable of producing a maximum line width of approximately 48 mm., consisting of 192 printed dots having a density of approximately 4 dots/mm., and a dot pitch of 0.25 mm. The interface PC between the monitor 10 and the printer 15 is operative to cause the printer to produce a hard copy of the various signal faults sensed by the monitor 10.

Figure 2:
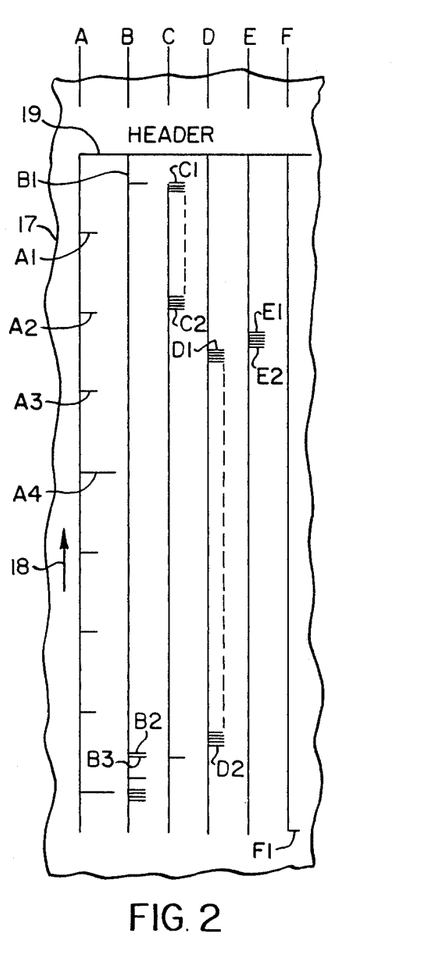
FIG. 2 is a fragmentary plan view showing the face of a paper printout produced by the printer shown in FIG. 1.

For example, referring to FIG. 2, 17 denotes part of a sheet of paper which has been produced by the printer 15 in response to various signals received from monitor 10, and evidencing when one or more of the voltage faults corresponding to the LED's B through F has been sensed, and indicating also the interval of time during which each such fault was sensed. In the illustrated embodiment paper 17 has printed thereon six, laterally spaced, vertical lines that are denoted in FIG. 2 by the letters A, B, C. D, E and F, and which extend longitudinally of the paper, or in the direction in which it is fed, as indicated by the arrow 8. Each of these vertical lines has one or more short, black, horizontal lines or bars projecting at right angles from the right side thereof. As noted in greater detail hereinafter, the horizontal bars which project from the line A, and which are denoted at A1, A2, etc., denote time intervals, while the horizontal bars which project from lines B–F provide a printed record of the appearance of any signal faults corresponding to the LED's B through F of the monitor 10.

By way of illustration, when the printer 15 is in operation the paper 17 will travel continuously in the direction indicated by the arrow 18, for example at the rate of 60 mm/hr. As soon as the printer becomes energized, a so-called HEADER is printed, and is underlined by a horizontal header line denoted at 19 in FIG. 2. The header may include one or two horizontal lines of information, including the name or trademark of the equipment being used, and if desired, abbreviated headings of the various faults which are to be recorded relative to the vertical lines B through F. The header line 19 constitutes the zero time indicator, and may utilize, if desired, the full 192 dot matrix width.

After the header line 19 has been printed the printing head will produce, in addition to the vertical lines A through F, and generally at successive, equal increments from the header line 19 the horizontal, time-indicating bars A1, A2, etc., which represent predetermined equal intervals of time during which the printer has been in operation. If during the first interval of operation a voltage spike occurs, its presence would be recorded on paper 17 by the printing of the bar B1 (FIG. 2). As shown in the drawing, this voltage spike occurred only momentarily; and no other voltage spike appeared until the printer had been in operation for several more timer intervals, at which time a second voltage spike occurred and was recorded as at B2. Moreover, as indicated by the line B3, this spike lasted for approximately two feeding increments (double the dot pitch) of the paper 17, after which it disappeared to reoccur moments later.

Referring to line C (FIG. 2), it will be noted that at the time that the first voltage spike was recorded at B1, the monitor also sensed that the voltage at that time not only went high, as indicated by the horizontal bar C1, but also remained high for more than a full time interval, finally disappearing after the printing of the bar C2. Also as shown in FIG. 2, after the printer had been in operation for just over two time intervals (i.e. after bar A2) the monitor 10 sensed that the voltage swung low, as indicated by the bar D1, which is the first of many such bars which were printed during each incremental advance of the paper 17 during approximately the next four intervals of operation of the printer, finally ending with the mark denoted at D2 in FIG. 2. The marks between D1 and D2 indicate that for a rather prolonged period of time the monitored voltage was lower than the desired, operational voltage.

Referring again to FIG. 2, it will be noted that this drop in the voltage (D1–D2) was preceded by a momentary voltage drop out, which occurred shortly after the printer had been in operation for the intervals A1 and A2; and as indicated by the first bar E1 of several such bars that were printed, this drop out lasted for several moments. After the last of such bar (E2) was printed, the voltage returned but nevertheless remained undersirably low as indicated by bars D1 et seq.

Finally, whenever the power is completely turned off or completely fails, as sensed by the monitor 10, the printer head prints at one side of trace line F a horizontal bar, such as bar F1 in FIG. 2, indicating that the printer was stopped by the monitor 10 at this particular time. If the termination of the power supply was initiated by the printer itself, the bar F1 would be printed or extend from the opposite side of trace line F. Whenever the printer is thereafter restarted, of course, the HEADER and header line 19 will again be printed, and the time intervals A1, A2 etc. will be measured from the last-printed header in a manner which will be apparent from the above-noted description.

It will be noted that the various fault denoting bars B1, C1, D1 and E1 are equal in length, and for purposes of the description herein will be considered to be the equivalent of a sixteen dot bar, while bar F1 is an eight dot bar. In other words, consider that the line of 192 dots, which is capable of being printed at any given instant by the printer head, consists of twenty-four successive 8 bit bytes or blocks of data, and each of the recording or printing "tracks" is comprised of one or more bytes of printing separated by one or more bytes of non-printing. The following table lists each of the 24 bytes or sectors per track (in order from left to right on the printed record) and its printed content:

| BYTE OR SECTOR | CONTENT |
| --- | --- |
| 1 | Base line and half of 15-minute TIME mark |
| 2 | Second half of 15-minute TIME mark |
| 3 | First half of 1-hour TIME mark |
| 4 | Second half of 1-hour TIME mark |
| 5 | Inter-track space (no printing) |
| 6 | Base line and half of SPIKE fault mark |
| 7 | Second half of SPIKE fault mark |
| 8 | Inter-track space (no printing) |
| 9 | Inter-track space (no printing) |
| 10 | Base line and half of HIGH VOLTAGE fault mark |
| 11 | Second half of HIGH VOLTAGE fault mark |
| 12 | Inter-track space (no printing) |
| 13 | Inter-track space (no printing) |
| 14 | Base line and half of LOW VOLTAGE fault mark |
| 15 | Second half of LOW VOLTAGE fault mark |

-continued

| BYTE OR SECTOR | CONTENT |
|---|---|
| 16 | Inter-track space (no printing) |
| 17 | Inter-track space (no printing) |
| 18 | Base line and half of voltage DROPOUT fault mark |
| 19 | Second half of voltage DROPOUT fault mark |
| 20 | Inter-track space (no printing) |
| 21 | Inter-track space (no printing) |
| 22 | Power-down in the PRINTER fault mark |
| 23 | POWER baseline & power-down in the MONITOR fault mark |
| 24 | No printing |

Referring to FIG. 2, each of the bars B1-E1 will comprise two, successive 8 bit bytes, or sixteen successive dots, whenever a particular fault is sensed and printed for a given horizontal line of print, but F1 will comprise a single byte. If no fault is present, only one dot (the first of the above-noted sixteen dots) is printed, thus producing a corresponding vertical line B, C, D, E or F on paper 17. The printer thus functions as a strip chart recorder providing a printed record for the characteristics B through F. Except for every fourth bar in the illustrated embodiment, the time bars A1, A2, etc. also comprise sixteen dots each. Every fourth bar is made slightly longer (e.g. a three or four byte length) merely for convenience in observing recorded time periods.

Figure 3A:
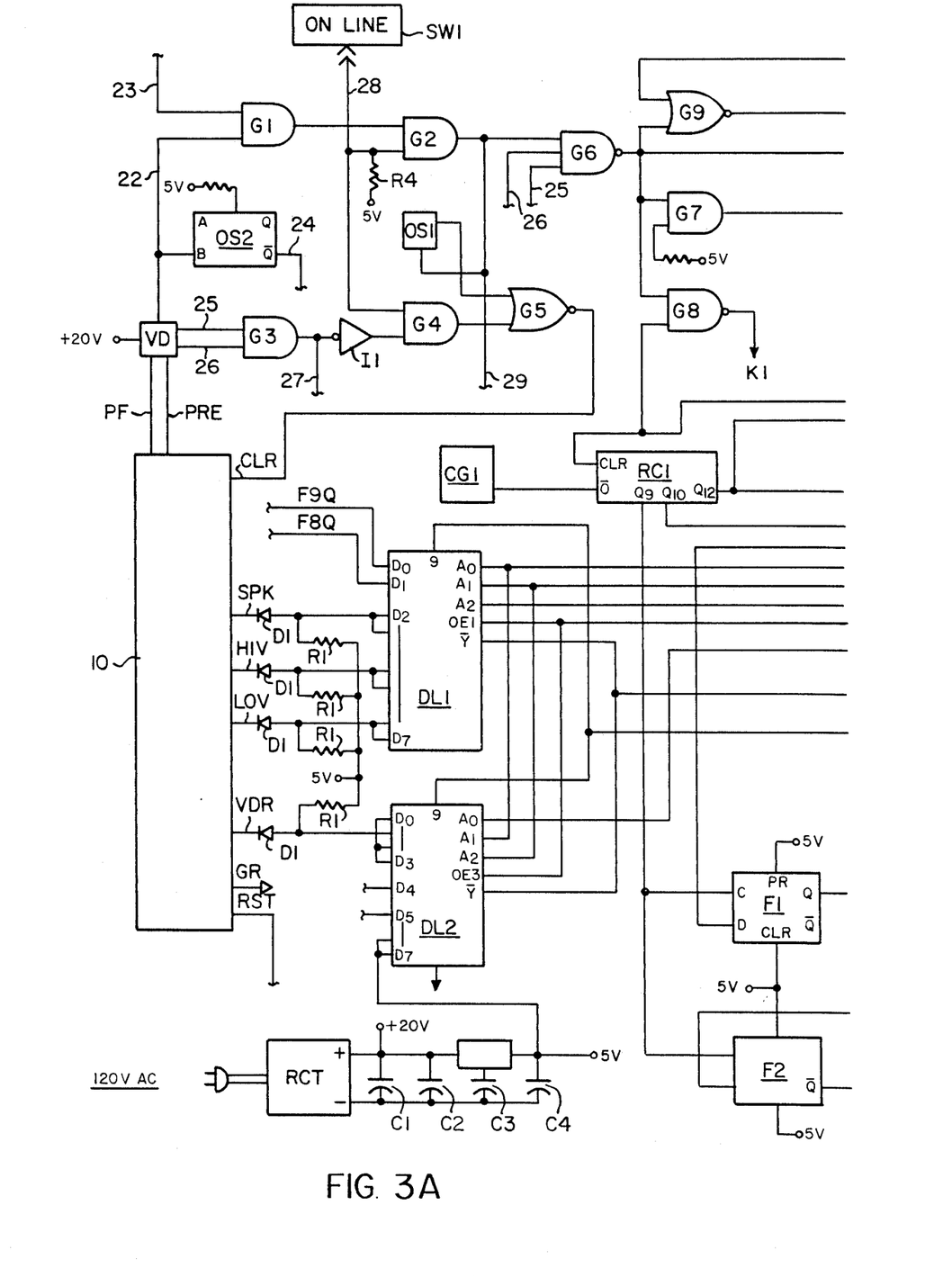
FIGS. 3A, 3B and 4 constitute a wiring diagram showing one type of printer controller circuit by which the outputs of the monitoring module can be connected to the printer to produce a printed record of the type shown in FIG. 2.
Figure 3B:
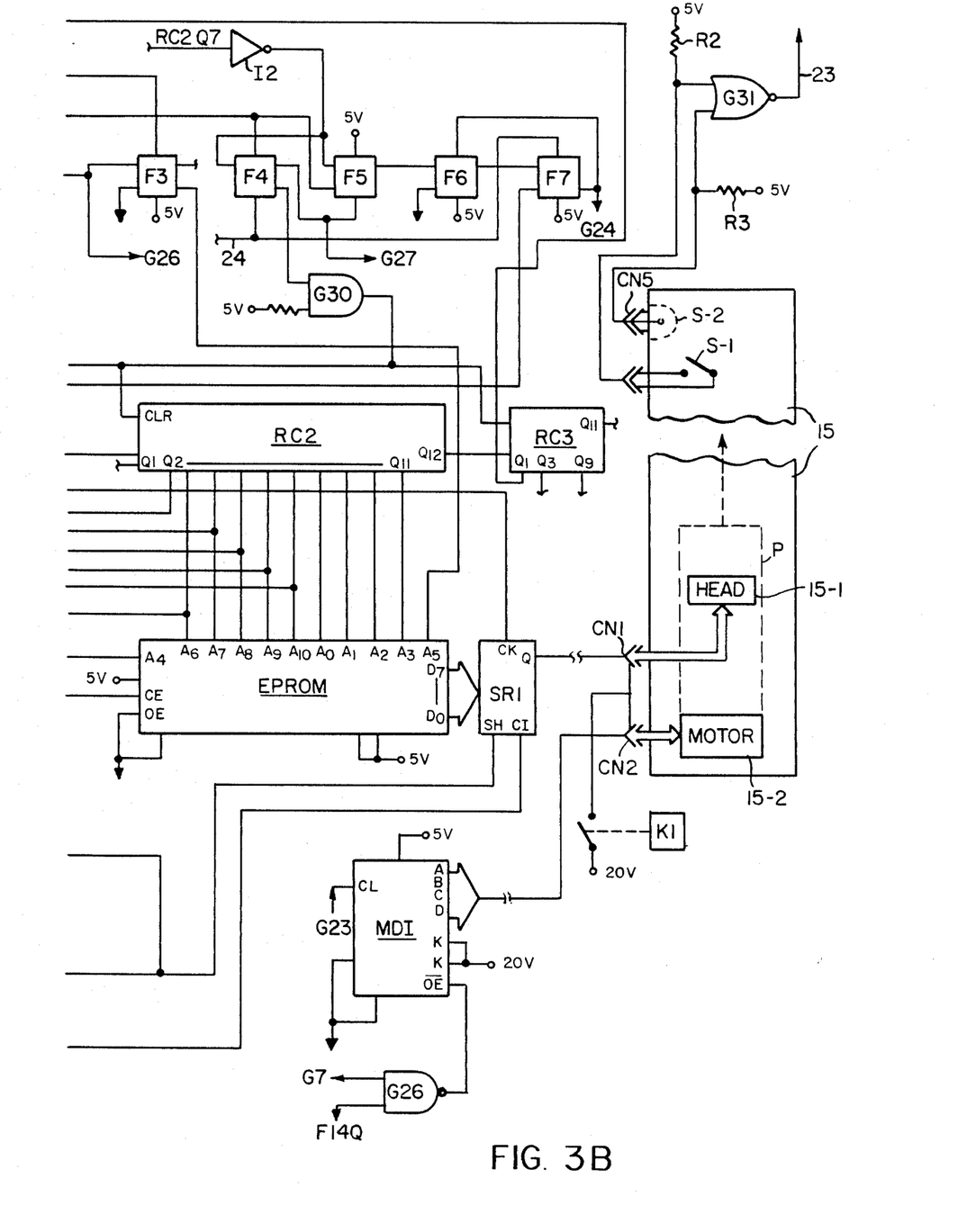
Figure 4:
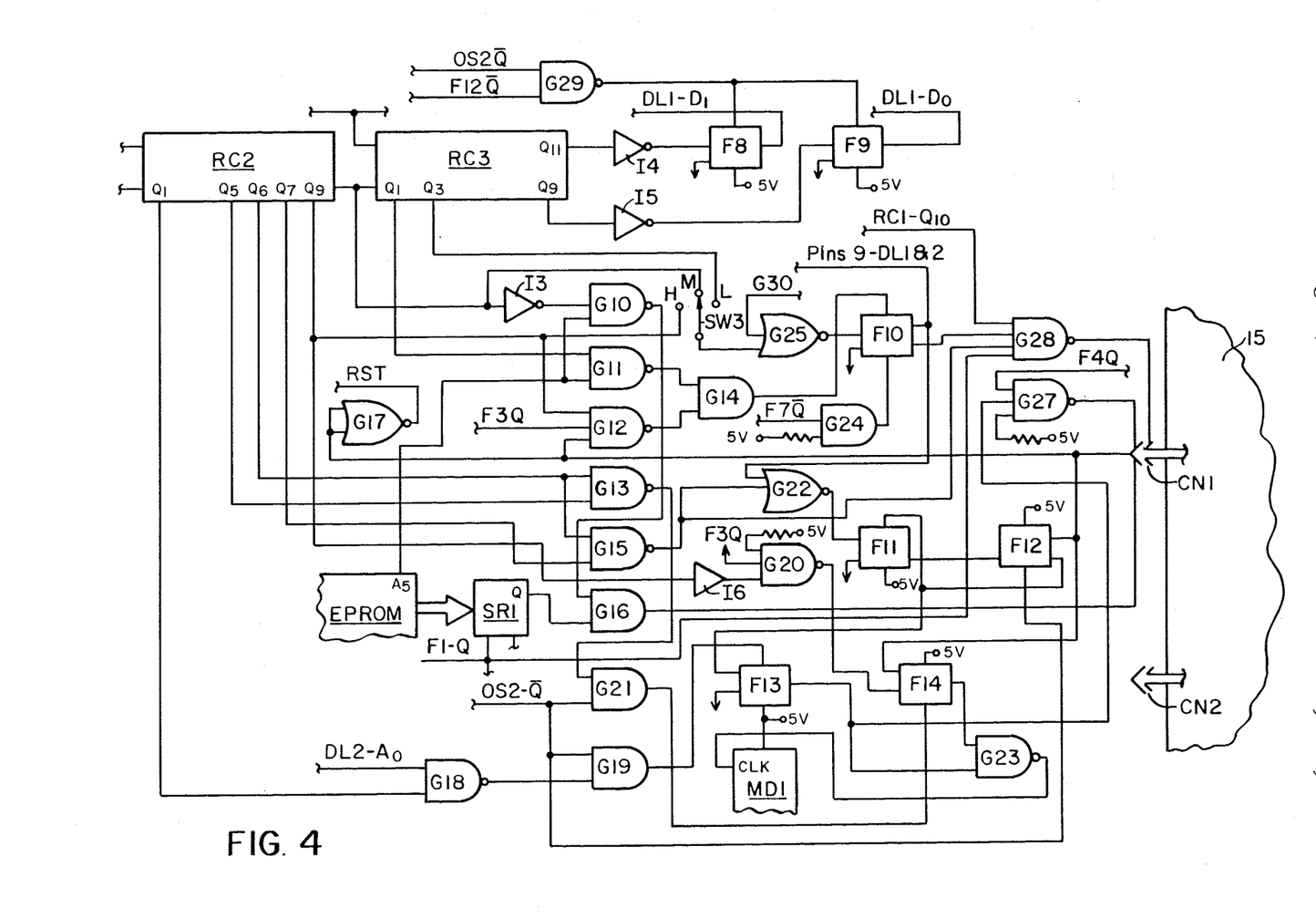

Referring now to the PC circuit shown by the wiring schematic of FIGS. 3 and 4, the cable 14 (FIG. 3) contains ten lines or conductors, only nine of which are utilized in connection with this particular embodiment. Included are lines SPK, HIV and LOV, which are adapted to receive signals whenever the monitor LED's B, C and D, respectively, are energized, thus denoting the presence of a voltage spike, high voltage or low voltage, respectively. Each of these lines is connected to the cathode of one of three, like diodes D1, the anodes of which are connected to three inputs of a first data latch DL1, and through like resistors R1 to a 5 volt power supply. A fourth line VDR is connected to the LED E of the monitor to receive a signal whenever voltage drop-out occurs. Line VDR is connected to the cathode of another diode D1, the anode of which is connected to one of the inputs of a second data latch DL2, and through a resistor R1 to the +5 volt power supply.

Also leading to monitor 10 from cable 14 is a ground line GR, and a reset line RST disposed to receive a signal from the PC circuit for restoring the latching circuits in monitor 10 to no-fault conditions in which the LED's B through F are not illuminated. Another line is denoted CLR and is utilized to apply to the monitor from the PC a clearing signal which performs the same function as the clear button on the monitor —i.e., it reactivates the monitor if it has had a power failure and restores all of its latching circuits to a no-fault condition. An eighth line is denoted PRE and constitutes a +10 volt status or printer enable line, which tells the PC that the monitor 10 is both connected and powered; and the remaining line PF is connected to the power failure LED denoted at F in FIG. 1, and is designed to provide a logic 0 whenever a power failure occurs at the monitor. The lines SPK, HIV, LOV and VDR also are designed to present to the PC circuit a logic 0 whenever a respective fault occurs as indicated by the associated LED.

The PC circuit is disposed to be powered from a conventional 120v AC power supply, which is applied to the input of a rectifier RCT (FIG. 3), the output of which produces separate +5 v and +20 v DC power sources tat are necessary to operate the PC and printer circuits. The +20 v output also is connected to a series of capacitors C1–C4 which store and provide sufficient energy to print fault bar F1 should the AC power supply to RCT fail. The time base for the control circuit is supplied by a crystal clock oscillator CG1 operating at 9.545 MHz. The clock output is applied to the input of the first stage of a 36-stage ripple counter which is represented in FIG. 3 by the three series connected counters RC1, RC2 and RC3. These counters are tapped at various points to derive the clock signals for a variety of the circuit elements.

The above-noted data latches DL1 and DL2 comprise two 8-bit addressable latches which function only when normal recording or printing is taking place—i.e., not when the header is being printed. The latches supply fault data for an EPROM, which also contains in its memory all of the additional data necessary to print the header and other repetitive data necessary for the on-going record. The EPROM has a one-byte output which is converted to a serial stream of data by a parallel to serial converter SR1 before being fed to the printer 15. The converter SR1 has a shift/load terminal SH connected to the output pin Q of a flip-flop F1, and a clock inhibit terminal CI connected to the Q terminal of flip-flop F2, which is connected in cascade with F1. (Flip-flop F1 is typical of those employed in the PC circuit so only its pin placements have been specifically identified.)

Referring now to the printer 15 as illustrated in FIG. 3, CN1 denotes a cable which supplies power and data to the print head 15-1 of the printer. The printhead 15-1, which forms no part of this invention, contains not only 192 individual heating elements, but also a 192-bit shift register, latches and drivers for those elements. Data to be printed is presented from SR1 as a serial bit stream in parallel with a synchronous clock. Once the 192 bits have been shifted in, the data is "latched" in and then "strobed" to do the actual driving of the thermal elements.

The motor 15-2 for the printer 15 is connected to the printer controller circuit by a cable CN2, which receives from a motor driver chip MD1 the four-phase drive currents for this particular stepping motor. The motor is driven with essentially square waves from a positive 20 volt DC power supply. Drive pulses must be controlled in duration as well as in their phase relation to each other. Power need not be applied between steps, nor in a non-recording condition in order to maintain the rest position of the paper.

Also connected to the printer is a cable CN3 which is used to indicate to the printer control circuit whether or not the platen of the printer is up or down. As shown in FIG. 3, this sensing is accomplished by a mechanical switch S-1 which is closed when the platen is down. In its down position, the platen presses the paper P against the thermal printing elements in the printing head, and against the drive roller (not illustrated). The platen must be raised to feed new paper to the printer.

Also shown in FIG. 3 is a cable CN5, which is connected to an infra-red emitter S-2 (broken lines in FIG. 3), which detects whether or not the printing paper P is present. If not, the switch S-2 will, in effect, be in a closed mode, and as noted hereinafter will prevent operation of the thermal head 15-1 and the stepping motor 15-2.

At the outset, it should be noted that before any printing can take place, including the header, the stepping motor for the printer must be subjected to sixteen so-called "preamble" stepping cycles to enable synchronization between the position of the motor rotor and the position of the counter which generates the driving phases for the motor. This preamble will therefore take place each time the printer starts up after having been shut down.

Assuming that at the start of an operation the monitor 10 is turned on and ready for operation, and that the ON LINE switch SW1 is closed to indicate that printer 15 is likewise ready, a positive 10 volt signal will appear on line PRE to indicate the ready status of the monitor 10. The signal is applied to one side of a voltage divider VD having one output on line 22 applied to one input of an AND gate G1. The other input to this gate is received on line 23 from the output of a NOR gate G31 having two inputs which are connected, respectively, through the connectors CN3 and CN5 to the switches S and S-1. These inputs are also connected through resistors R2 and R3 to separate five volt power supplies, which are shunted to ground through the switches S-1 and S-2 whenever these two switches are closed, as for example when paper is present in the printer and the platen is down. This maintains the output of gate G31 high on line 23 to indicate platen down, and the presence of paper P in the printer. If either switch S-2 or S-1 is opened, the output on line 23 drops, so that the gate G1 is no longer enabled. This is true also if the voltage divider VD does not supply from its positive 20 volt source the necessary five volt power needed for operating components of the printer circuit, in which case the output on line 22 will drop to prevent enablement of gate G1.

The signal on line 22 also triggers a one-shot device OS2, which produces on line 24 an initializing pulse to set or guarantee the initial state of each of a series of hereinafter described flip-flops, F4, F7, F8, F9, F12, F13 and F14, some of which in turn control the state of other flip-flops F5, F6 and F10.

If the proper signals are present on the power failure line PF and the printer enable line PRE, the voltage divider VD has output signals on each of lines 25 and 26, which form the inputs to an AND gate G3. With proper input signals gate G3 provides an output signal which is supplied by a line 27 to an input of DL2, and through an inverter V1 to one input of an AND gate G4, the other input of which is received on a line 28 from the front panel of the printer 15, when the printer ON LINE switch SW1 is closed. This switch is a push-push toggle switch which is manually operable selectively to place the printer in operation when it is otherwise ready. When gate G4 is enabled, its output is applied to one input of a NOR gate G5, the output of which, when driven low, produces on line CLR a signal that clears the monitor 10 by restoring its latching circuits to no-fault conditions as noted above.

As previously noted, gate G1 monitors the platen and paper in the printer 15, and when enabled its output is applied to one input of another AND gate G2, the other input of which is connected to line 28, and through a resistor R4 to a 5 volt power supply. The output of gate G2 is applied by line 29 to another input of DL2, and also sets a one-shot OS1, the output of which is applied to another input of the NOR gate G5 so that the duration of the clear pulse at the output of this gate can be extended to cover the operating time of the monitor restoring relay (not illustrated). The output of gate G2 is supplied to one of the inputs of an AND gate G6, two other inputs of which are supplied by the voltage divider VD outputs 25 and 26.

Gate G6 signifies when all of the conditions are met necessary for printing, and its output sets flip-flops F4, and F3 from the clock pulse through gate G7. The flip-flop F3 is the "header" flip-flop, and its output is applied to an address (A5) of the EPROM to enable the output of the preprogrammed header, when otherwise permitted by the herinafter described gating circuits F3 also inhibits gate G12 (FIG. 4) which normally allows only one printed line to be output. During production of the header it is desired to step thirty-two lines and to print the header in the last sixteen of these lines, after which the gate G11 is enabled to stop the process after thirty-two lines. The flip-flop F4 through gate G30 enables gate G8 and the ripple counters RC1, RC2 and RC3, which start counting the master clock, and which produce the time sequences for printing. The output of G8 results in the energization of a relay K1 (FIG. 3), which causes the +20 v supply to be applied to the printer motor 15-2 and head 15-1 through CN1 and CN2. RC1, through the cascaded flip-flops F1 and F2 also produces the above-noted shift/load and clock inhibit signals for the parallel-to-serial converter SR1.

The clock signal for SR1 is derived from a tap $Q_{10}$ on the counter RC1 (FIG. 3). This tap is adjacent to the tap $Q_9$, which through the flip-flops F1 and F2, generates the controls for the SR1 in order that the propagation delays in the counter RC1 do not create a problem in the SR1. The clock signal for SR1 is also applied as an input to gate G28 (FIG. 4), and thus functions through the cable input CN1 as the clock signal for the printer head 15-1. The flip-flop F4 also provides the enabling signal for gate G27 (FIG. 4), which eventually provides through the plug CN1 the strobing signal for the printing head.

Referring again to FIG. 3, the gate G6 also produces through gates G7 and G26 the output enable signal for the motor driver MD1. The flip-flop F4, through gates G30 (FIG. 3) and G25 (FIG. 4) provide the clock signal for the flip-flop F10 (FIG. 4), and sets it to enable the gate G28, and the OR gate G22. F3 also enables gates G10 and G11; and gate G10, through G16, inhibits, at the outset, any output from the converter SR1 until after the first sixteen "preamble" steps of the printer motor 15-2. As noted above, the "preamble" steps are required to synchronize the motor and the driver; and during this interval no printing takes place. However, after sixteen blank lines have occurred G10 will enable gate G16 and allow data to be outputted in a serial steam through the plug CN1 to the print head 15-1.

Thereafter gate G11 through gate G14 resets the flip-flop F10, which then stops the printing and motor stepping cycles. The same signal ($Q_1$ of our RC3), which initiated the reset of flip-flop 10, also, through the OR gate G9 resets F3 and stops the header printing mode. The ripple counters, however, remain active under the control F4.

During the printing of the header there is a sub-routine that is synchronized with the writing of each line. Five sequential outputs of RC2 ($Q_3$ through $Q_7$) are connected to the EPROM as address lines, and each unique combination of these five bits corresponds to one byte of the printed line. However, since there are only twenty-four bytes, and five bits produce thirty-two combinations, the hardware is arranged so that during the time of the eight unused no print bytes, the information that has been previously sent to the printer assembly is lodged and printed, and the motor is stepped to its next recording position. This is achieved by decoding $Q_6$ and $Q_7$ of RC2 in gate G15 (FIG. 4), and clocking F11. The F11 output is synchronously reproduced in F12, one output of which resets F11 and initiates an output of F13, and the other output of which provides a data latch strobe signal through the plug CN1 to the printer head 15-1, and through the OR gate G17 produces a reset signal RST, which is applied to the monitor 10. The outputs of F13 and F14 are now applied to gate G23, the output of which enables the step clock pulse for the motor drive MD1. The output of F13 also is applied as a print command signal through the gate G27 and the plug CN1 to the printer head 15-1 thereby to energize the thermal elements in the head.

After the printing of the header the control circuit PC settles down to a routine of printing one line of data periodically based on the setting of the print speed switch SW3 (FIG. 4), which can be placed in any one of three positions: H for high speed operation, M for medium speed operation, and L for low speed operation. This switch SW3, depending upon to which counter tap it is connected, periodically couples a counter transition through the OR gate G25 to set the flip-flop F10. The setting of F10 again starts the printing cycle except that now the EPROM is receiving additional information from the data latches DL1 and DL2, and is printing only one dot line at a time.

Actually the printing of each dot line is done three successive times with only one motor step or advance at the end of the three printings. This function is incorporated as a means to allow subsequent use of the same printer to record from three different monitors through a so-called "stunt" box, which would sequentially present each individual monitor's data to the printer's input. For this reason the PC circuit issues three reset pulses RST for each line of data printed, and the concept is that the "stunt" box would sequence the individual's monitor data under control of the RST pulses. Holding off of the reset of F10 for three successive print cycles is accomplished through gate G12, which is enabled by $Q_9$ of RC2 and the non-header mode of operation.

Printing continues as long as the PC circuit is satisfied that all conditions are being met. It may be terminated by one or more of many actions, for instance the monitor may be de-powered or disconnected from the printer, the ON LINE switch may be opened, the printer may be de-powered, or the printer itself may run out of paper or someone may lift the platen. As soon as the PC circuit detects any of one of these conditions it shifts into a shut-down mode, and attempts to print one more line while there is still reserve power in the +20 v supply capacitors C1-C4. Termination based on the monitor 10 is indicated by the output of gate G3, which therefore signals pin $D_4$ of the data latch DL2, while termination by the printer 15 is indicated by a signal from the gate G2 and from the line 29 and pin $D_5$ of latch DL2. On the other hand, termination from any source is indicated by the output of gate G6, which, through gate G7, prevents the motor from being stepped, and changes the data input to flip-flop F5. The ripple counters RC1, RC2 and RC3, on the other hand, remain active, and on the next negative transition of pin $Q_7$ of counter RC2 flip-flop F5 is set. The output of F5 clocks the input of F6, which with F7, produces a short pulse to set, through the output of gate G24, flip-flop F10.

As noted above, the output of F10 controls the print cycle, so the PC circuit now goes through a cycle, and in so doing prints out the horizontal bar F1 to one side or the other of the trace line F (FIG. 2), depending upon whether the stoppage originated with the printer or the monitor.

The flip-flops F6 and F7 then reset themselves, F7 the agency of pin $Q_{12}$ of counter RC1, and on the next negative transition of $Q_7$ of the counter RC2 the flip-flop F4 is reset by the inverter 12 (FIG. 3), and in turn resets F5. If the shutdown is due to any reason other than operation of the ON LINE switch SW1, the PC circuit is in a stand-by mode, and if all conditions for printing are otherwise restored, it will automatically restart by printing the header and going back on ON LINE.

From the foregoing it will apparent that the present invention provides a compact and reliable hard copy or printed record of power line faults which may have occurred during the operation of a computer, or the like, over a prolonged period of time. The obvious advantage of such equipment is that it enables an operator to determine the origin and the nature of a fault simply by review of the printout produced by the equipment, thus pinpointing the source of the trouble, and thereby avoiding unnecessary down time of the associated equipment and/or undersirable loss of data. Still another advantage of this equipment is that the monitor 10 can be utilized, selectively, with or without the associated PC circuit and printer 15, simply by uncoupling the cable connection 14 between the monitor and the PC. Moreover, the PC circuit permits the monitor 10 to be employed in conjunction with a conventional printer 15, which also, if desired, could be utilized independently of monitor 10. This enables the most efficient use of the associated equipment. Furthermore, through use of the ON LINE switch SW1, the operator has the option to leave all of the equipment connected (the monitor 10, the PC circuit, and the printer 15), but to choose not to record a hard copy of the fault signals merely by operating switch SW1 to take the printer off line.

Still another advantage of this apparatus is that the printer 15 produces a strip-chart "event" recording of information provided by monitor 10, and incorporates therein a relative time base, which commences from the end of the header printing. This enables the operator to determine not only the particular nature of the fault, but also the exact time when the fault occurred during the operation of the equipment. Still another advantage is that the switch SW3, enables the operator selectively to determine the rate at which the recording is made, simply by setting this switch to advance the printer paper at one of three different rates, corresponding generally to a high, medium or low rate. Furthermore, in the event that power is removed from the PC circuit, a fault which might otherwise prevent the circuit from producing any printed record of the failure of its power, the capacitors in the +20 v power supply, make it possible to utilize the discharge of the capacitors to effect the printing of the power failure mark F1 (FIG. 2).

By using the data latches D61 and D62 temporarily to store the fault data, it facilitates printing because it is possible to address the data latches at the same time as the EPROM, and the resulting print information is automatically presented at the right time and place in the printing cycle. However, to reduce the bit storage requirements of these data latches, the twenty-four bytes or sectors have been combined into only twelve 2-byte groups so that only two 8-bit latches are required for temporary data storage. By looking at the above-noted table which describes the bytes or sectors for each printing track, it can be seen that each two-sector pair represents either the same information or, at least, non-conflicting information. The data latches are addressed at half the rate of the EPROM so that each latch bit produces two bytes of print information. This arrangement of the printing format makes possible a more efficient use of expensive hardware in exchange for inexpensive memory.

In a "normal" recording mode the print cycle is initiated approximately every 14 seconds by the clock and ripple counter. At this initiation the data then present at the inputs to the data latches is "latched in" and any changes occurring at those inputs during the printing cycle are ignored. The latches are sequentially addressed and their content is transformed by presentation to the EPROM into the desired print information which is converted into a serial bit-stream by SR1 and transmitted to the data registers in the printer. When the printing cycle is completed, the monitor 10 is reset and the data latches are again receptive to new data.

The EPROM memory is used to provide the data for the header printing as well as to transform the fault data from the monitor 10 into the base line and bars that are used to record faults. The organization of the memory is tied to the format of the printing and the motion of the paper so that it is possible to make efficient use of the hardware by utilizing taps off the ripple counter as memory addresses. Since the data for printing each line must be presented to the printer from left-to-right and the paper moves so as to print from top-to-bottom, higher frequency taps on the ripple counter are used to address the EPROM for each line data (horizontal data), and lower frequency taps to address the EPROM for data for subsequent lines in the header (vertical data). Since characters are printed when printing the header, it takes seven lines to produce each character line. However, when printing faults, there is no "vertical" data (as in the header) because each line of recording is complete unto itself. As address of the 192-dot printing head occurs, address of the input latches and the memory occurs simultaneously. If the addressed input latch comes back with a "fault" in—e.g. the HIV track, then the status of this "fault" line changes the input to a memory address line and the memory outputs to print an 8-dot wide bar. If the addressed input latch had come back with "no fault", then the memory would have output to print a one-dot base line for the left-most "one" bit.

Although this invention has been illustrated and described in connection with only certain embodiments thereof, it will be apparent that this application is intended to cover any such modification as may fall within the scope of one skilled in the art, or the appended claims.

I claim:
1. The combination comprising
an electrically operated printer having a paper feed mechanism for advancing paper from a supply thereof through said printer,
a power line monitor for sensing predetermined voltage variations in the power supplied to a computer,
control circuit means interposed between said printer and said monitor and responsive to signals from said monitor and said printer during advance of said paper through said printer to cause said printer to print on said paper in the form of a strip chart a record of the respective voltage variations sensed by said monitor,
said control means including driver means for selectively operating said feed mechanism at a predetermined rate, whereby said strip chart indicates the time of occurrence of said recorded voltage variations,
said feed mechanism being a stepper motor operative in response to signals from said driver means to advance said paper intermittently in equal increments,
said printer being a dot line printer having a linear array of printing elements extending transversely of the path of travel of said paper through said printer,
said control means including printer signal means operative in the intervals between the incremental advances of said paper selectively to operate said printing elements to cause said strip chart to be printed on said paper, and
said printer signal means comprising first signal source means operative during advance of said paper to cause certain of said elements to print on said paper a first series of spaced, parallel, laterally registering lines extending in the direction of travel of said paper, and equal in number to the different voltage variations sensed by said monitor, and second signal source means responsive to said signals from said monitor to cause certain others of said elements selectively to print on said paper during said intervals a second series of lines each of which extends transversely from a different one of said parallel lines to denote the presence of predetermined one of said voltage variations.

2. The combination as defined in claim 1, including means for selectively connecting said control circuit means to said monitor and to said printer, respectively, whereby said monitor and said printer may be operated independently of each other without utilizing said control circuit means.

3. The combination as defined in claim 1, wherein said first signal source means includes means operative immediately prior to the printing of said first series of parallel lines to cause said elements to print predetermined indicia on said paper to form a heading for said first series of lines.

4. The combination as defined in claim 3, wherein said driver means includes means for causing said stepper motor to advance said paper a predetermined number of equal increments immediately prior to the printing of said heading on said 5. The combination as defined in claim 4, wherein said driver means further includes switch means for selectively adjusting said predetermined rate at which said feed mechanism is operated.

6. The combination as defined in claim 1 said second signal source means includes
means operative when power is removed from said monitor to print one of said second series of lines to extend in one direction from a predetermined one of said first series of parallel lines, and
means operative when power is removed from said printer to print a line which extends from said predetermined line in a direction opposite to said one line of said second series.

7. The combination as defined in claim 1, wherein said first signal source means includes
means for causing at least one other of said elements to print on said paper during advance thereof one additional line parallel to said first series of lines, and
means for causing still others of said elements intermittently to print on said paper during advance thereof, and at equal intervals of time, a third series of lines extending transversely from said one additional line and parallel to said second series of lines.

8. The combination as defined in claim 1, wherein each of said second series of lines is equal in length.

9. The combination as defined in claim 1, wherein said monitor has a plurality of signal outputs each of which is representative of a different one of said respective voltage variations,
said linear array of printing elements are disposed to be selectively energized by a series of digital signals received from said control circuit means,
said second signal source means comprises data latch means connected to the outputs of said monitor to receive and temporarily to store digital data signals representing said voltage variations,
said first signal source means comprises digital data signals stored in a memory in said control circuit means, and
said control circuit means further includes means for selectively clocking data signals out of said latch means and said memory in a stream of serial data bits which are fed to said array of elements to effect the printing of said strip chart.

* * * * *